United States Patent
Han

(10) Patent No.: US 8,198,640 B2
(45) Date of Patent: Jun. 12, 2012

(54) SEMICONDUCTOR LIGHT EMITTING DEVICE AND METHOD OF FABRICATING THE SAME

(75) Inventor: Jae Cheon Han, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 291 days.

(21) Appl. No.: 12/445,188

(22) PCT Filed: Dec. 12, 2008

(86) PCT No.: PCT/KR2008/007390
§ 371 (c)(1),
(2), (4) Date: Apr. 10, 2009

(87) PCT Pub. No.: WO2009/075551
PCT Pub. Date: Jun. 18, 2009

(65) Prior Publication Data
US 2010/0187559 A1   Jul. 29, 2010

(30) Foreign Application Priority Data

Dec. 13, 2007   (KR) .................. 10-2007-0129977

(51) Int. Cl.
*H01L 27/15* (2006.01)
*H01L 31/12* (2006.01)
*H01L 33/00* (2010.01)

(52) U.S. Cl. .................................. 257/81; 257/99

(58) Field of Classification Search .............. 257/99, 257/81
See application file for complete search history.

(56) References Cited

U.S. PATENT DOCUMENTS

| 5,977,565 | A | 11/1999 | Ishikawa et al. |
| 6,191,438 | B1 | 2/2001 | Ikehara et al. |
| 2003/0122135 | A1 | 7/2003 | Ogihara et al. |
| 2005/0236637 | A1 | 10/2005 | Zhao et al. |
| 2010/0295088 | A1* | 11/2010 | D'Evelyn et al. ............ 257/99 |

FOREIGN PATENT DOCUMENTS

| JP | 9-275226 A | 10/1997 |
| JP | 1176497 A | 3/1998 |
| JP | 2003-188411 A | 7/2003 |
| JP | 2004-342885 A | 12/2004 |
| JP | 1630106 A | 6/2005 |
| JP | 1666351 A | 9/2005 |

\* cited by examiner

*Primary Examiner* — Thien F Tran
(74) *Attorney, Agent, or Firm* — Birch, Stewart, Kolasch & Birch, LLP

(57) ABSTRACT

Provided is a semiconductor light emitting device and a method of fabricating the same. The semiconductor light emitting device comprises: a first conductive semiconductor layer; an active layer on the first conductive semiconductor layer; a second conductive semiconductor layer on the active layer; a second electrode part on the second conductive semiconductor layer; an insulation layer on the second electrode part; and a first electrode part on the insulation layer, a portion of the first electrode part being electrically connected to the first conductive semiconductor layer.

20 Claims, 7 Drawing Sheets

[Fig. 1]
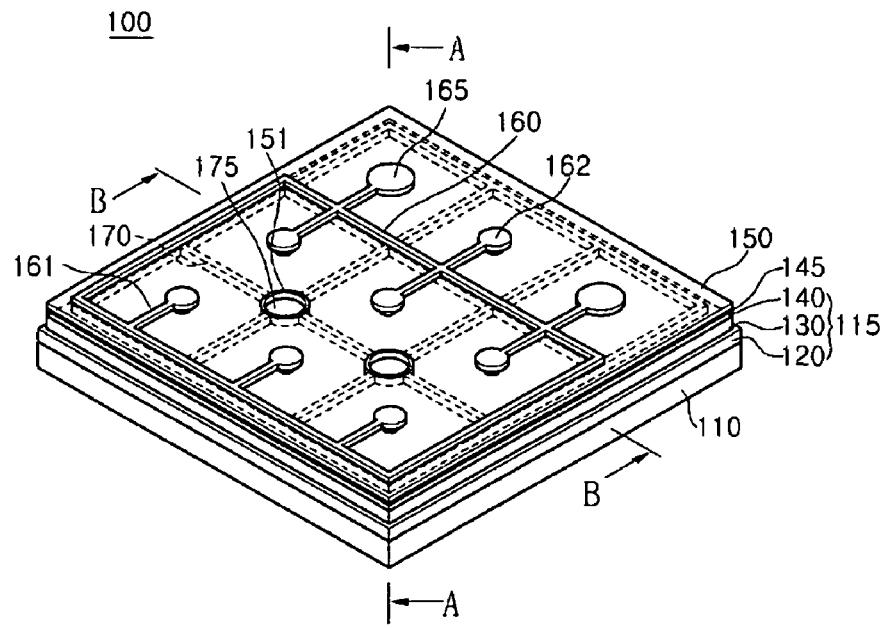
[Fig. 2]
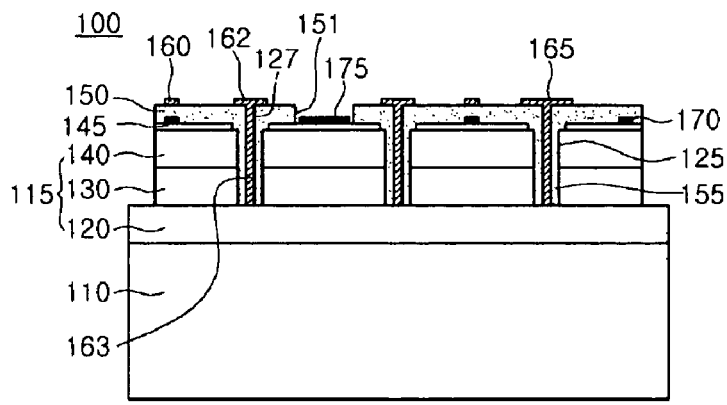
[Fig. 3]
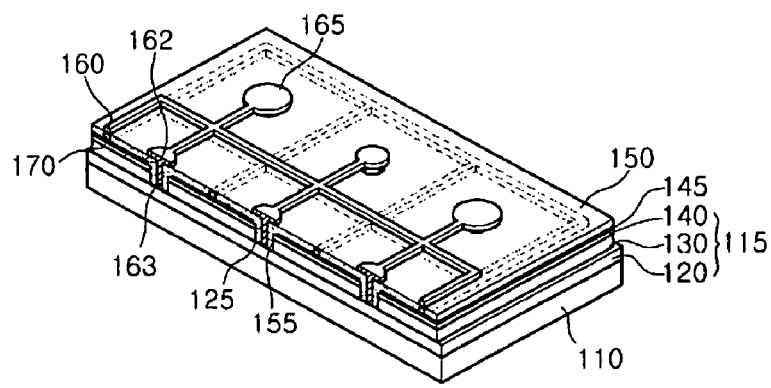

[Fig. 4]
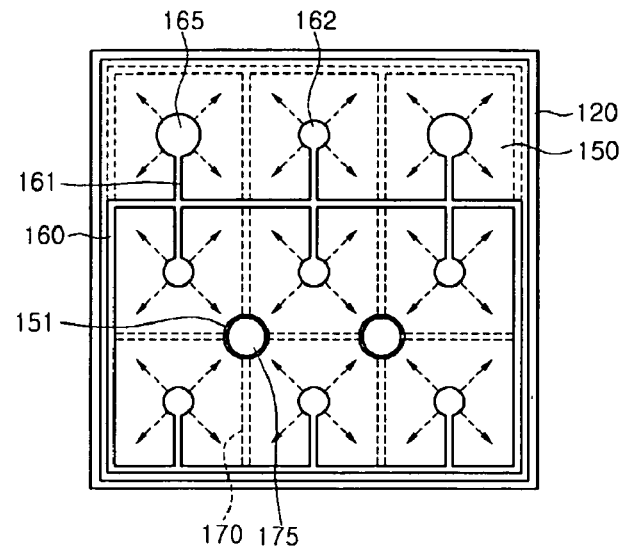
[Fig. 5]
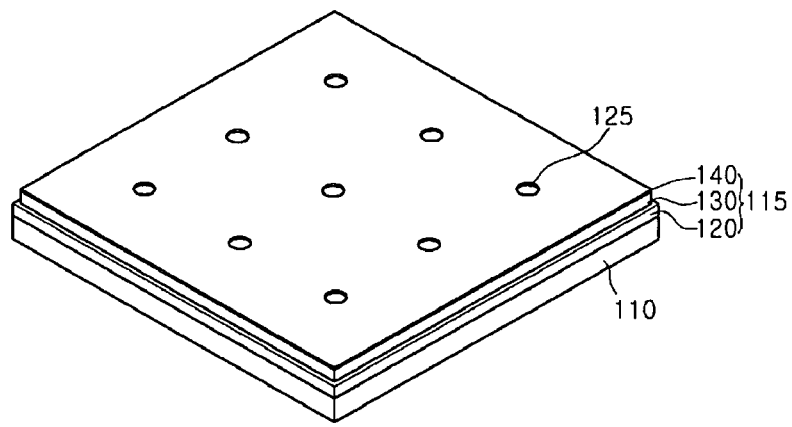
[Fig. 6]
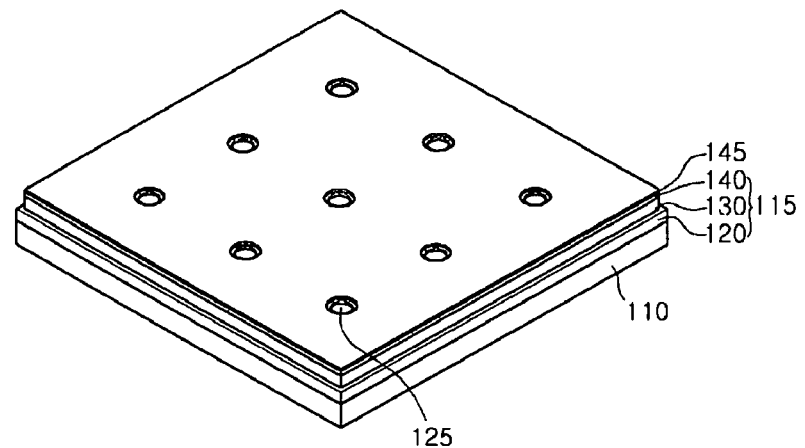

[Fig. 7]
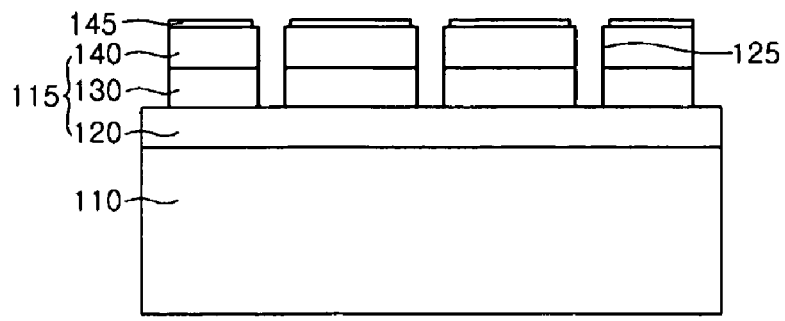
[Fig. 8]
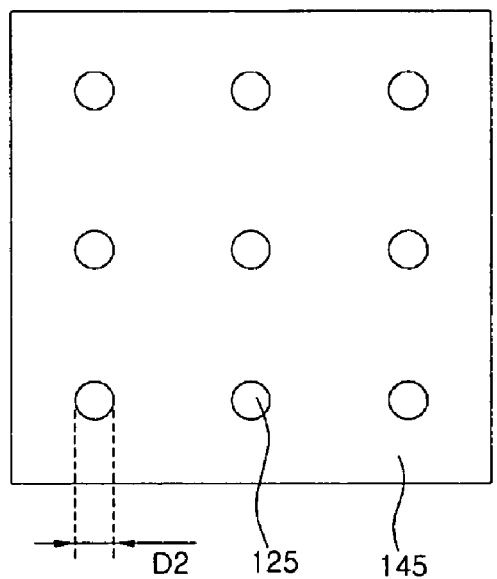
[Fig. 9]
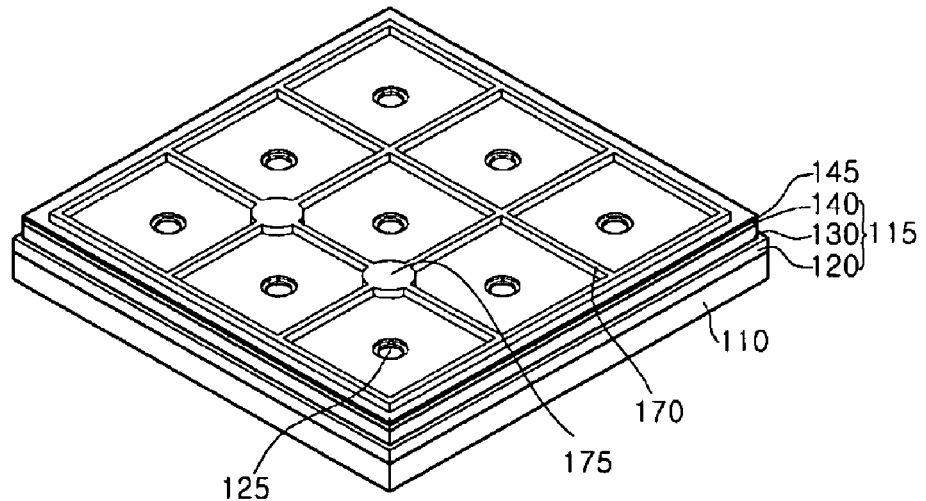

[Fig. 10]
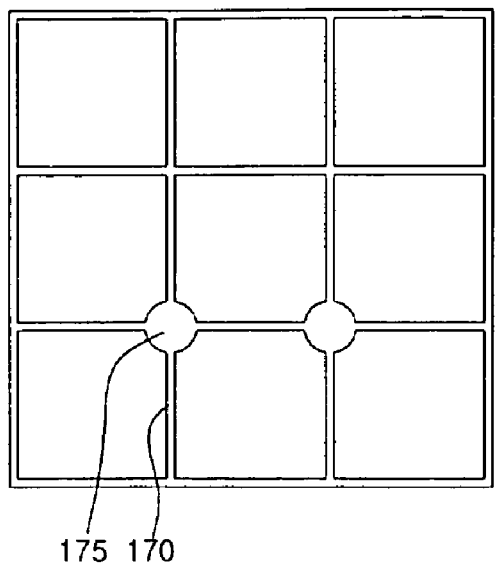
175 170
[Fig. 11]
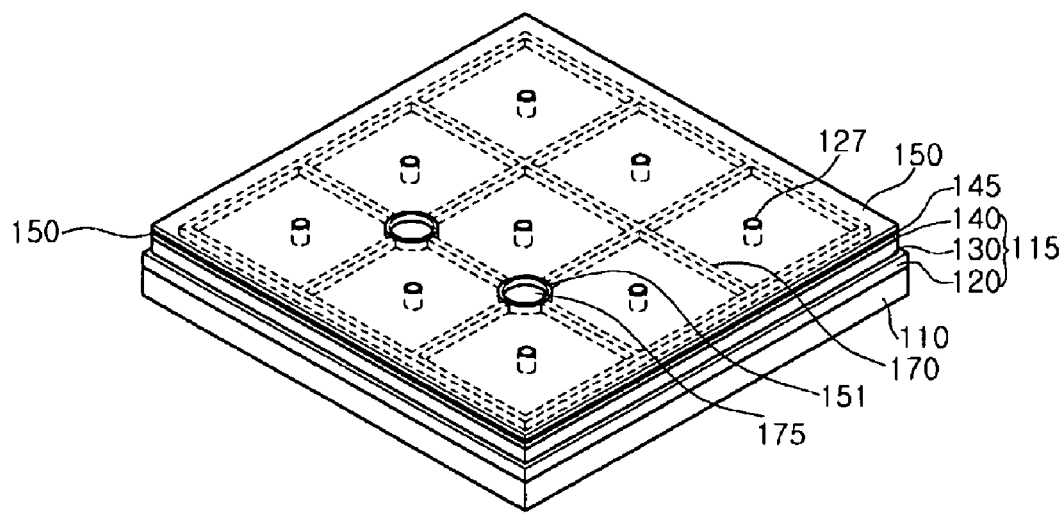
[Fig. 12]
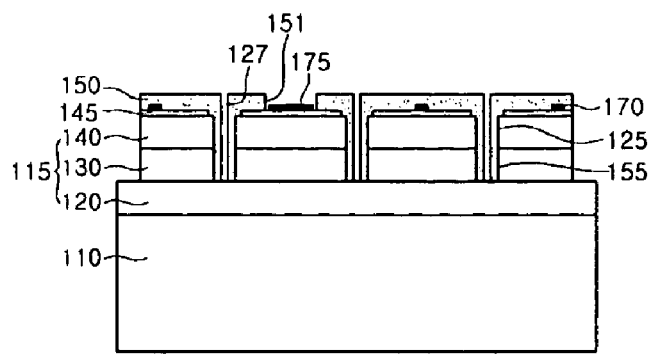

[Fig. 13]
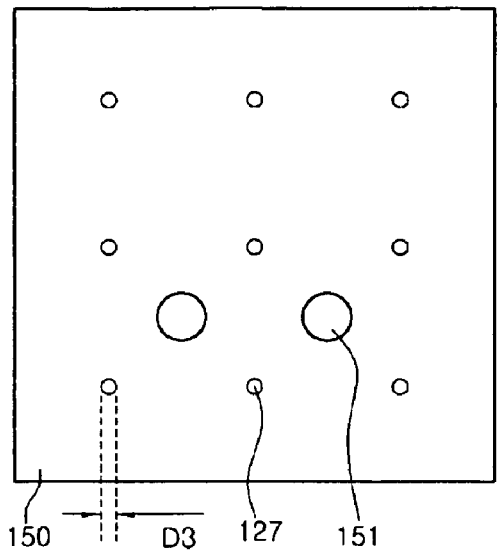
[Fig. 14]
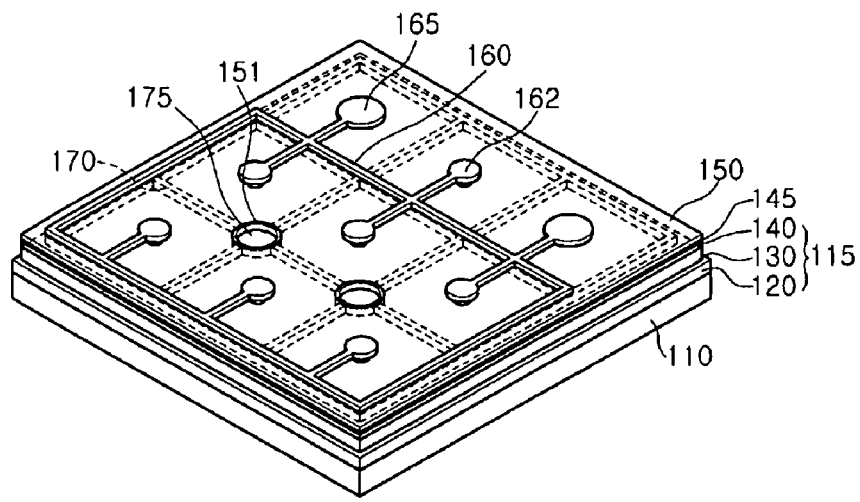
[Fig. 15]
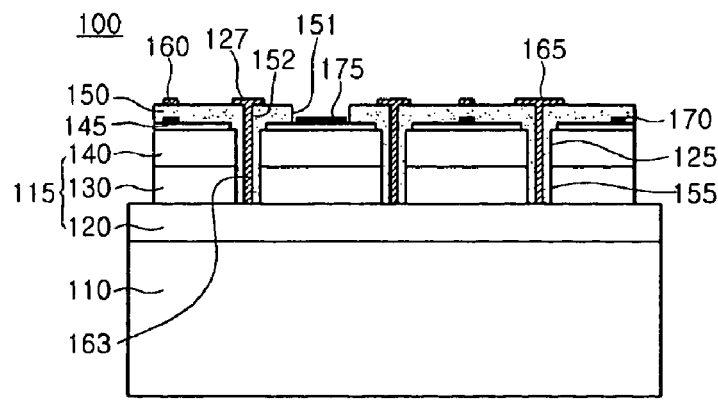

[Fig. 16]
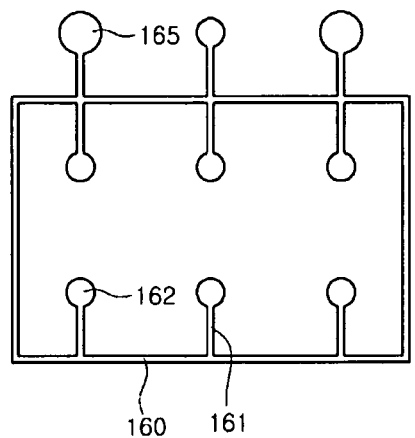
[Fig. 17]
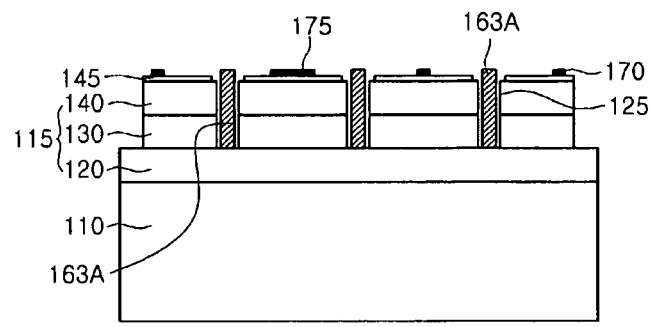
[Fig. 18]
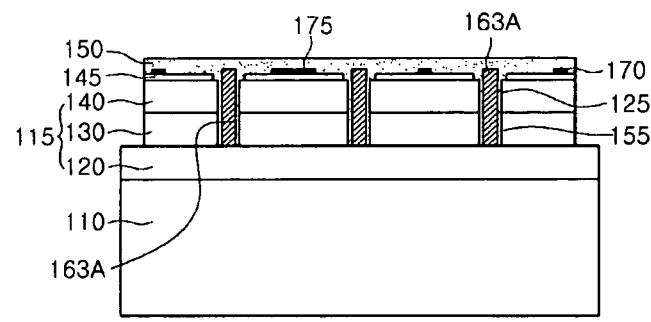
[Fig. 19]
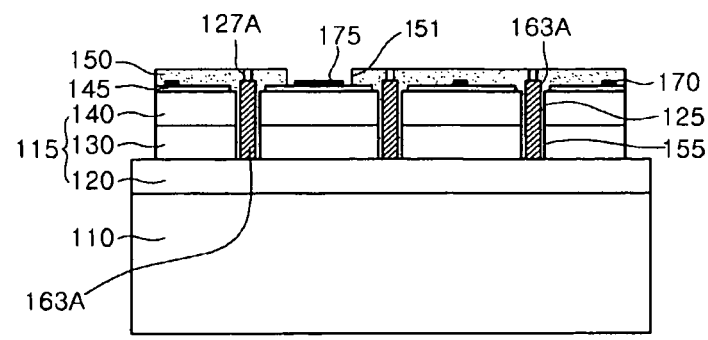

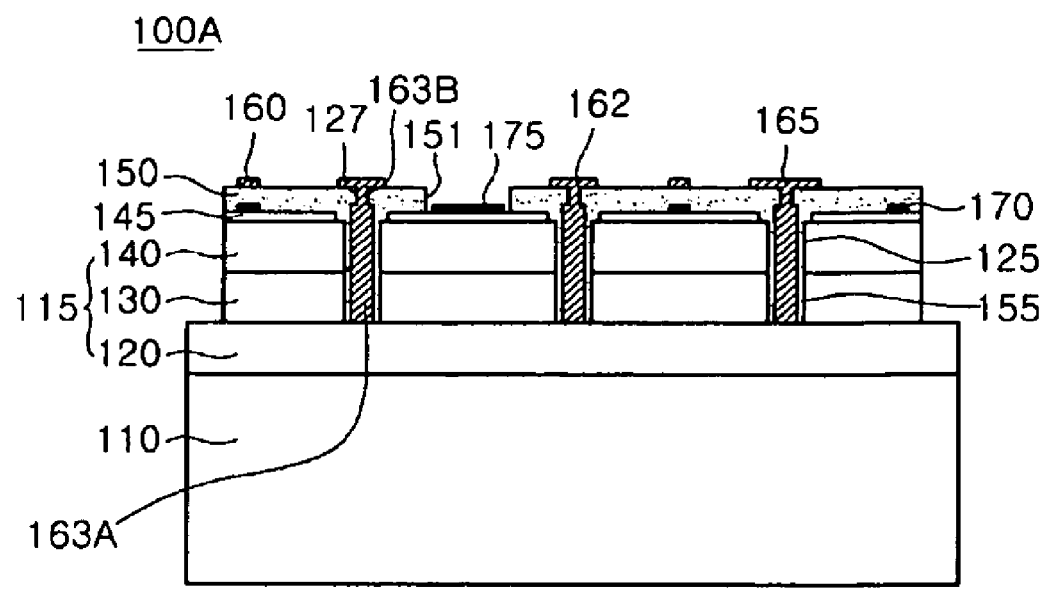
[Fig. 20]

SEMICONDUCTOR LIGHT EMITTING DEVICE AND METHOD OF FABRICATING THE SAME

TECHNICAL FIELD

Embodiments relate to a semiconductor light emitting device and a method of fabricating the same.

BACKGROUND ART

Group III-V nitride semiconductors have been variously applied to optical devices such as blue and green light emitting diodes (LEDs), high speed switching devices such as a Metal Semiconductor Field Effect Transistor (MOSFET) and a Hetero junction Field Effect Transistor (HEMT), and light sources of lighting devices or display devices. Especially, a light emitting device using a group III nitride semiconductor has a direct transition-type band gap corresponding to the ranges from a visible ray to an ultraviolet ray to realize high efficient light emission.

The nitride semiconductor is mostly applied to LEDs or laser diodes (LDs). Research for improving a manufacturing process or light efficiency has been continuously made.

DISCLOSURE OF INVENTION

Technical Problem

Embodiments provide a semiconductor light emitting device comprising a first electrode part connected to a first conductive semiconductor layer in a via form, on a light emitting structure, and a method of fabricating the same.

Embodiments provide a semiconductor light emitting device where a second electrode part spatially overlaps a partial pattern of a first electrode part, on a light emitting structure, and a method of fabricating the same.

Embodiments provide a semiconductor light emitting device capable of improving the degree of pattern freedom for first and second electrode parts, and a method of fabricating the same.

Technical Solution

An embodiment provides semiconductor light emitting device comprising: a first conductive semiconductor layer; an active layer on the first conductive semiconductor layer; a second conductive semiconductor layer on the active layer; a second electrode part on the second conductive semiconductor layer; an insulation layer on the second electrode part; and a first electrode part on the insulation layer, a portion of the first electrode part being electrically connected to the first conductive semiconductor layer.

An embodiment provides a semiconductor light emitting device comprising: a first conductive semiconductor layer; an active layer on the first conductive semiconductor layer; a second conductive semiconductor layer on the active layer; a second electrode part on the second conductive semiconductor layer; an insulation layer on the second electrode part; and a first electrode part on the insulation layer, a portion of the first electrode part being electrically connected to the first conductive semiconductor layer in a via form.

An embodiment provides a method of fabricating a semiconductor light emitting device comprising: forming a first conductive semiconductor layer, an active layer, and a second conductive semiconductor layer; forming at least one via hole in the second conductive semiconductor layer, the via hole penetrating a portion of the first conductive semiconductor layer; forming a second electrode part on the second conductive semiconductor layer around the via hole; forming an insulation layer on the second electrode part and the via hole; and forming a first electrode part on the insulation layer, a portion of the first electrode part being electrically connected to the first conductive semiconductor layer through the via hole.

Advantageous Effects

Embodiments provide the degree of pattern freedom for first and second electrode parts disposed on and under an insulation layer.

Embodiments split patterns of electrodes on and under an insulation layer to supply a diffused current.

Embodiments improve external light emitting efficiency.

Embodiments arrange a partial pattern of an electrode part to spatially overlap so as to improve a light emitting area.

Embodiments provide a high output LED.

Embodiments improve the degree of pattern freedom for an electrode part.

Embodiments improve tolerance for ESD.

BRIEF DESCRIPTION OF DRAWINGS

FIG. 1 is a side-sectional view illustrating a semiconductor light emitting device according to an embodiment.

FIG. 2 is a side-sectional view taken along a line A-A of FIG. 1.

FIG. 3 is a side-sectional view taken along a line B-B of FIG. 1.

FIG. 4 is a plan view of FIG. 1 and illustrates an example of current distribution in an electrode part.

FIGS. 5 to 16 are views illustrating a process of fabricating a semiconductor light emitting device according to a first embodiment.

FIGS. 17 to 20 are views illustrating a process of fabricating a semiconductor light emitting device according to a second embodiment.

BEST MODE FOR CARRYING OUT THE INVENTION

Hereinafter, a semiconductor light emitting device and a method of fabricating the same according to embodiments will be described in detail with reference to the α-companying drawings. In the following description, when a layer (or film) is referred to as being on and under another layer, its description will be made with reference to the accompanying drawings. The thickness of each layer may be described as one example, and is not limited to the thicknesses of the accompanying drawings.

In the description of embodiments, it will be understood that when each layer (or film), area, pattern, or structure is referred to as being "on/under" another substrate, layer (or film), area, pad, or pattern, it can be "directly" on the another substrate, layer (or film), area, pad, or pattern, or intervening layers may also be "indirectly" present.

FIG. 1 is a side-sectional view illustrating a semiconductor light emitting device according to a first embodiment. FIG. 2 is a side-sectional view taken along a line A-A of FIG. 1. FIG. 3 is a side-sectional view taken along a line B-B of FIG. 1.

Referring to FIG. 1, a semiconductor light emitting device 100 comprises a substrate 110, a light emitting structure 115, a transparent electrode layer 145, an insulation layer 150, a first electrode part 160, and a second electrode part 170.

The substrate 110 may be formed of one selected from the group comprising $Al_2O_3$, GaN, SiC, ZnO, Si, GaP, InP, and GaAs. A convex and concave pattern may be formed on the substrate 110 and has a lens form.

The light emitting structure 115 is formed on the substrate 110. Here, another semiconductor layer, for example, a buffer layer (not shown) or/and an undoped semiconductor layer (not shown), may be formed between the substrate 110 and the light emitting structure 115. The buffer layer and the undoped semiconductor layer are disposed to reduce a lattice constant difference between the substrate 110 and the semiconductor or to prevent defectiveness, and this is not limited to the buffer layer and the undoped semiconductor layer.

The light emitting structure 115 comprises a first conductive semiconductor layer 120, an active layer 130, and a second conductive semiconductor layer 140. Here, the light emitting structure 115 may further comprise another semiconductor layer on or under each layer and is not limited to the layer structure.

The first conductive semiconductor layer 120 is formed on the substrate 110. The first conductive semiconductor layer 120 may be realized with a semiconductor having an empirical formula of $In_xAl_yGa_{1-x-y}N$ ($0 \leq x \leq 1, 0 \leq y \leq 1, 0 \leq x+y \leq 1$) and is doped with a first conductive dopant. The first conductive semiconductor layer 120 is a compound semiconductor of a group III element and a group V element and may be formed of GaN, InN, AlN, InGaN, AlGaN, InAlGaN, or AlInN. When the first conductive semiconductor layer 120 is an N-type semiconductor layer, the first conductive dopant is an N-type dopant and the N-type dopant comprises Si, Ge, or Sn.

The active layer 130 is formed on the first conductive semiconductor layer 120. The active layer 130 may have a single quantum well structure or a multi quantum well structure. The active layer 130 has a period of a well layer and a barrier layer through a compound semiconductor material of a group III element and a group V element. For example the period may comprise a period of an InGaN well layer/a GaN barrier layer or a period of an AlGaN well layer/a GaN barrier layer.

The active layer 130 is formed of a material having band gap energy based on a wavelength of an emitted light. For example, if the wavelength is a blue light of 460 nm to 470 nm, the active layer 130 may have a single or multi quantum well structure by a period of an InGaN well layer/a GaN barrier layer. The active layer 130 may comprise a material for emitting colored light such as blue wavelength light, red wavelength light, and a green wavelength light.

A conductive clad layer (not shown) may be formed on or/and under the active layer 130, and the conductive clad layer may be realized with an AlGaN layer.

A second conductive semiconductor layer 140 is formed on the active layer 130. The second conductive semiconductor layer 140 may be realized with a semiconductor having an empirical formula of $In_xAl_yGa_{1-x-y}N$ ($0 \leq x \leq 1, 0 \leq y \leq 1, 0 \leq x+y \leq 1$) and is doped with a second conductive dopant. The second conductive semiconductor layer 140 may be formed of a compound semiconductor of a group III element and a group V element such as GaN, InN, AlN, InGaN, AlGaN, InAlGaN, and AlInN. When the second conductive semiconductor layer 140 is a P-type semiconductor layer, the second conductive dopant is a P-type dopant, and the P-type dopant comprises Mg, Zn, Ca, Sr, or Ba.

Additionally, a third conductive semiconductor layer (not shown) is formed on the second conductive semiconductor layer 140. The third conductive semiconductor layer may be formed of an N-type semiconductor layer if the second conductive semiconductor layer 140 is formed of a P-type semiconductor layer, and the third conductive semiconductor layer may be formed of a P-type semiconductor layer if the second conductive semiconductor layer 140 is formed of an N-type semiconductor layer.

The light emitting structure 115 may be formed of a P-N junction, an N-P junction, a P-N-P junction, or an N-P-N junction within the technical scope of embodiments. Each layer may be formed of a single layer or a multi layer, and another semiconductor layer may be added on or under each layer. Each layer is not limited to a stacked layer structure of the components.

The transparent electrode layer 145 is formed on the second conductive semiconductor layer 140 of the light emitting structure 115. The transparent layer 145 may be formed of at least one of materials for light transmittivity and ohmic-contact such as indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminium zinc oxide (AZO), antimony tin oxide (ATO), ZnO, RuOx, TiOx, IrOx, $SnO_2$, and NiAu, but is not limited thereto. The transparent electrode layer 145 distributes current and supplies it to the active layer 130. The transparent electrode layer 145 may not be formed on the second conductive semiconductor layer 140.

The second electrode part 170 and 175 may be formed on the transparent electrode layer 145 and is divided into a second electrode 170 and a second electrode pad 175. The second electrode 170 and the second electrode pad 175 may be directly or/and indirectly connected to at least one of the transparent electrode layer 145 and the second conductive semiconductor layer 140. The second electrode pad 175 may be electrically connected to the second conductive semiconductor layer 140 through hole of the transparent electrode layer 145.

Additionally, the second electrode part 170 and 175 may be directly formed on the second conductive semiconductor layer 140 if the transparent electrode layer 145 is not formed. Another material layer (e.g., a reflective electrode layer) other than the transparent electrode layer 145 may be formed on the second conductive semiconductor layer 140. The reflective electrode layer may be formed of Al, Ag, Pd, Rh, or Pt and may improve reflective efficiency when a chip is mounted through a flip method. If the reflective electrode layer is formed on the second conductive semiconductor layer 140, the second electrode 170 may not be additionally formed.

The second electrode 170 and the second electrode pad 175 may be formed of at least one layer using a mixed material comprising at least one of Ag, Ag alloy, Ni, Al, Al alloy, Rh, Pd, Ir, Ru, Mg, Zn, Pt, Au, and Hf, but are not limited thereto.

The second electrode 170 may have at least one of a line-shaped pattern, a curve-shaped pattern, a line and curve mixed pattern, a branch-shaped pattern branching one pattern into the plural number of patterns, a polygonal pattern, a striped pattern, a lattice pattern, a dot pattern, a diapered pattern, a parallelogram pattern, a mesh pattern, a streak pattern, a cross pattern, a radial pattern, and a combinational pattern thereof, but is not limited thereto.

If the second electrode 170 is formed of a lattice pattern of a polygonal form such as a quadrangle form, a pentagonal form, and a hexagonal form, the second electrode 170 may be disposed along the outline of a chip and a peripheral region of the chip center.

The second electrode pad 175 may be electrically connected to a predetermined position of the second electrode 170. The second electrode pad 175 may be formed in single or plurality, and the plurality of second electrode pads 175 may be disposed separated from each other. The second electrode pad 175 is disposed on a region where the second electrode 170 intersects, or formed at a pattern diverging from the second electrode 170. Additionally, the second electrode pad 175 may be disposed on the center region, a center peripheral region, and the edge region, and the center region of each side, but is not limited thereto.

Here, the second electrode pad 175 may be a portion of the second electrode 170 or may be additionally formed in the second electrode 170.

The second electrode part 170 and 175 diffuses current and supplies it through the transparent electrode layer 145 and the second conductive semiconductor layer 140. The second electrode part 170 and 175 prevents current from being concentrated on one area and improves tolerance for ESD.

The insulation layer 150 is formed on the transparent electrode layer 145 and the second electrode 170. The insulation layer 150 may be realized with an insulating material or a dielectric substance. For example, an insulation layer 150 may be formed of a silicon oxide (e.g., $SiO_2$, etc.), a silicon nitride (e.g., $Si_xN$, etc.), a metal oxide (e.g., a Ti oxide), but is not limited thereto.

A second pad hole 151 is formed in the insulation layer 150 and the second electrode pad 175 is exposed through the second pad hole 151.

First electrode part 160 and 165 is formed on the insulation layer 150, and comprises a first electrode 160 and a first electrode pad 165. The first electrode 160 and the first electrode pad 165 may be formed of at least one or a plurality of mixed material selected from Ti, Al, In, Ta, Pd, Co, Ni, Si, Ge, Ag, and Au, and may be formed with a single layer or multi layer structure. The first electrode pad 165 may be used as a portion of the first electrode 160 or may be additionally formed.

The first electrode 160 may have at least one of a line-shaped pattern, a curve-shaped pattern, a line and curve mixed pattern, a branch-shaped pattern branching one pattern into the plural number of patterns, a polygonal pattern, a striped pattern, a lattice pattern, a dot pattern, a diapered pattern, a parallelogram pattern, a mesh pattern, a streak pattern, a cross pattern, a radial pattern, and a combinational pattern thereof, but is not limited thereto.

The first electrode 160 is formed of a pattern of a polygonal form such as a quadrangle form, a pentagonal form, and a hexagonal form. In a case of the pattern of the polygonal form, it may be formed along the chip outline region and a chip peripheral region.

The first electrode 160 is formed on the insulation layer 150, and the second electrode 170 is formed under the insulation layer 150. The first electrode 160 has a via electrode structure, and may be disposed on the insulation layer 150, crossing over the second electrode 170.

Additionally, the first electrode 160 may be arranged on the insulation layer 150 to overlap a partial pattern of the second electrode 170. The first electrode 160 and the second electrode 170 overlap spatially. The overlap interval or the size of the overlap area may vary according to the pattern formation of the first electrode 160 and the second electrode 170.

If the first electrode 160 overlaps a partial pattern of the second electrode 170 spatially, the reduction of a light emitting area can be prevented and thus external light emitting efficiency can be improved.

The first electrode pad 165 and the second electrode pad 175 may be disposed on a region for efficient power supply, and the region may be in single or plurality.

Referring to FIGS. 2 and 3, at least one of the first electrode 160 and the first electrode pad 165 may comprise at least one via electrode 163.

If the first electrode 160 has a polygonal pattern, it comprises a diverge electrode 161 diverging toward an inner side direction, a diverge node 162 connected to the diverge electrode 161, and a via electrode 163 of a via form connected to the diverge node 162. The via electrode 163 is formed through the electrode hole 127 and the first electrode hole 152 is formed in the via hole 125.

The diverge electrode 161 may diverge into at least one branch form in the pattern of the first electrode 160, and in a case of a multi-branch (e.g., a fork form), the branches are spaced a predetermined interval from each other.

If the first electrode 160 is formed with a pattern of a polygonal form, the diverge electrode 161 may diverge toward the pattern inner direction or/and outer direction of the polygonal form, and a diverge node 162 and the first electrode pad 165 may be electrically connected to the end portion of the diverge electrode 161.

At least one of a portion of the first electrode 160 and the first electrode pad 165 may become the diverge node 162. The diverge node 162 may be formed in single or plurality in the first electrode part 160 and 165.

The via electrode 163 is formed under the diverge node 162, and the via electrode 163 may be electrically connected to the first conductive semiconductor layer 120, on the insulation layer 150, with a via form. Additionally, the via electrode 163 comprises a via hole 125, a second electrode hole 127, and an insulation part 155.

The via hole 125 perpendicularly penetrates the insulation layer 150, the transparent electrode layer 145, the second conductive semiconductor layer 140, the active layer 130, and a portion of the first conductive semiconductor layer 120.

The via hole 125 may be formed with a circular pillar form or a polygonal pillar form, but is not limited thereto. The via hole 125 may be formed with a predetermined length and a predetermined width, and also may be formed with the same pipe diameter or respectively different pipe diameters.

The insulation portion 155 is filled in the surrounding of the via hole 125 to insulate the via electrode 163. Accordingly, the via electrode 163 is electrically insulated from other layers 145, 140, and 130. The first electrode 160 ohmic-contacts the first conductive semiconductor layer 120 through the via electrode 163.

The electrode hole 127 is formed in the inside of the insulation part 155 of the via hole 125, and is formed along the insulation part 155, from the insulation layer 150 to the first conductive semiconductor layer 120. The insulation part 155 electrically insulates the perimeter surface of the via electrode 163.

The bottom of the via electrode 163 contacts the top of the first conductive semiconductor layer 120 or the inner side of the first conductive semiconductor layer, or may penetrate the first conductive semiconductor layer 120. The via electrode 163 ohmic-contacts the first conductive semiconductor layer 120 and is disconnected from the other layers.

Once power is supplied through the first electrode pad 165, the supplied power is directly applied to the first conductive semiconductor layer 120, and is diffused through the first electrode 160 connected to the first electrode pad 165. Then, the power is delivered to the first conductive semiconductor layer 120 through the via electrode 163. Accordingly, the first electrode 150 can supply current to an entire region of the first conductive semiconductor layer 110.

FIG. 4 is a plan view of FIG. 1 and illustrates an example of current distribution in an electrode part.

Referring to FIGS. 1 to 4, once power is supplied through the second electrode pad 175 and the first electrode pad 165, the current supplied to the second electrode pad 175 is delivered to the transparent electrode layer 145 and the second conductive semiconductor layer 140 through the second electrode pad 175. The delivered current is uniformly supplied to an entire region of the transparent electrode part 145 through the second electrode 170 connected to second electrode pad 175.

The current supplied to the first electrode pad 165 is directly applied to the first conductive semiconductor layer 120 through the via electrode 163, or diverges along the first electrode 160 through the diverge electrode 161. Then, the current is supplied to the first conductive semiconductor layer 120 through the diverge node 162 and the via electrode 163.

The current supplied to the first conductive semiconductor layer 120 is diffused or distributed to an entire region through the plurality of via electrodes 163.

Accordingly, since the current is supplied to an entire region of the first conductive semiconductor layer 120 and the second conductive semiconductor layer 140, the active layer 130 can improve an inner light emitting efficiency and also improves tolerance for ESD.

FIGS. 5 to 16 are views illustrating a process of fabricating a semiconductor light emitting device according to a first embodiment.

Referring to FIG. 5, a light emitting structure 115 is formed on a substrate 110. The substrate 110 may be formed of one selected from the group comprising $Al_2O_3$, GaN, SiC, ZnO, Si, GaP, InP, and GaAs. A convex and concave pattern may be formed on the substrate 110, and has a lens form.

Another semiconductor layer, for example, a buffer layer (not shown) or/and an undoped semiconductor layer (not shown), may be formed between the substrate 110 and the light emitting structure 115. The buffer layer and the undoped semiconductor layer are disposed to reduce a lattice constant difference between the substrate 110 and a nitride semiconductor or prevent defectiveness.

The light emitting structure 115 comprises a first conductive semiconductor layer 120, an active layer 130, and a second conductive semiconductor layer 140.

The first conductive semiconductor layer 120 is formed on the substrate 110. The first conductive semiconductor layer 120 may be realized with a semiconductor having an empirical formula of $In_xAl_yGa_{1-x-y}N$ ($0 \leq x \leq 1, 0 \leq y \leq 1, 0 \leq x+y \leq 1$) and is doped with a first conductive dopant. The first conductive semiconductor layer 120 is a compound semiconductor of a group III element and a group V element and may be formed of GaN, InN, AlN, InGaN, AlGaN, InAlGaN, or AlInN. When the first conductive semiconductor layer 120 is an N-type semiconductor layer, the first conductive dopant is an N-type dopant and the N-type dopant comprises Si, Ge, or Sn.

The active layer 130 is formed on the first conductive semiconductor layer 120. The active layer 130 may have a single quantum well structure or a multi quantum well structure. The active layer 130 has a period of a well layer and a barrier layer through a compound semiconductor material of a group III element and a group V element. For example the period may comprise a period of an InGaN well layer/a GaN barrier layer or a period of an AlGaN well layer/a GaN barrier layer. The active layer 130 may comprise a material for emitting colored light such as blue wavelength light, red wavelength light, and a green wavelength light.

A conductive clad layer (not shown) may be formed on or/and under the active layer 130, and the conductive clad layer may be realized with an AlGaN layer.

A second conductive semiconductor layer 140 is formed on the active layer 130. The second conductive semiconductor layer 140 may be realized with a semiconductor having an empirical formula of $In_xAl_yGa_{1-x-y}N$ ($0 \leq x \leq 1, 0 \leq y \leq 1, 0 \leq x+y \leq 1$) and is doped with a second conductive dopant. The second conductive semiconductor layer 140 may be formed of a compound semiconductor of a group III element and a group V element such as GaN, InN, AlN, InGaN, AlGaN, InAlGaN, and AlInN. When the second conductive semiconductor layer 140 is a P-type semiconductor layer, the second conductive dopant is a P-type dopant, and the P-type dopant comprises Mg, Zn, Ca, Sr, or Ba.

Additionally, a third conductive semiconductor layer (not shown) is formed on the second conductive semiconductor layer 140. The third conductive semiconductor layer may be formed of an N-type semiconductor layer if the second conductive semiconductor layer 140 is formed of a P-type semiconductor layer, and the third conductive semiconductor layer may be formed of a P-type semiconductor layer if the second conductive semiconductor layer is formed of an N-type semiconductor layer.

The light emitting structure 115 may be formed of a P-N junction, an N-P junction, a P-N-P junction, or an N-P-N junction within the technical scope of embodiments. Each layer may be formed of a single layer or a multi layer, and another semiconductor layer may be added on or under each layer. Each layer is not limited to a stacked layer structure of the components.

When the second conductive semiconductor layer 140 is formed, mesa etching is performed on a channel region, that is, the chip boundary region, to expose an outer region of the first conductive semiconductor layer 120, and this process may not be performed.

Referring to FIGS. 5 to 7, during the mesa etching, at least one via hole 125 is formed. The via hole 125 penetrates from the second conductive semiconductor layer 140 to a portion of the first conductive semiconductor layer 120, or may penetrates the first conductive semiconductor layer 120.

Here, the forming of the via hole 125 may be performed after the forming of the second conductive semiconductor layer 140, or after the forming of the transparent electrode layer 145. The via hole 125 may have a circular pillar form or a polygonal pillar form, but is not limited thereto.

Referring to FIGS. 6 and 7, the transparent electrode layer 145 is formed on the second conductive semiconductor layer 140. At this point, since a mask pattern is formed around the via hole 125, foreign materials are prevented from flowing into the via hole 125.

FIG. 8 is a plan view of the transparent electrode layer 145. Referring to FIGS. 7 and 8, the diameter D2 of the via hole 125 in the transparent electrode layer 145 may be formed greater than that of the via hole thereunder.

The transparent layer 145 may be formed of at least one of materials for light transmittivity and ohmic-contact such as ITO, ZnO, RuOx, TiOx, IrOx, and NiAu. The transparent electrode layer 145 may not be formed, or a reflective electrode layer other than the transparent electrode layer 145 can be formed.

Referring to FIGS. 9 and 10, once the transparent electrode layer 145 is formed, a second electrode part 170 and 175 is formed on the transparent electrode layer 145. The second electrode part 170 and 175 comprises a second electrode 170 and a second electrode pad 175. The second electrode part 170 may be formed of at least one layer using one of Ag, Ag alloy, Ni, Al, Al alloy, Rh, Pd, Ir, Ru, Mg, Zn, Pt, Au, Hf, and a mixed material thereof, but is not limited thereto.

The second electrode pad 175 may be formed on the transparent electrode layer 145 or/and the second conductive semiconductor layer 140. The second electrode pad 175 may be electrically connected to the second conductive semiconductor layer 140 by forming hole in the transparent electrode layer 145.

Additionally, the second electrode part 170 and 175 may be formed on the second conductive semiconductor layer 140 if the transparent electrode layer 145 is not formed. Additionally, if a reflective electrode layer is formed on the second conductive semiconductor layer 140, the second electrode may not be formed.

The second electrode 170 may have at least one of a line-shaped pattern, a curve-shaped pattern, a line and curve mixed pattern, a branch-shaped pattern branching one pattern into the plural number of patterns, a polygonal pattern, a striped pattern, a lattice pattern, a dot pattern, a diapered pattern, a parallelogram pattern, a mesh pattern, a streak pattern, a cross pattern, a radial pattern, and a combinational pattern thereof, but is not limited thereto.

The second electrode 170 may be formed with a lattice pattern of a polygonal form such as a quadrangle form, a pentagonal form, and a hexagonal form. In a case of the pattern of the polygonal form, the second electrode 170 may be disposed along the chip circumference, the chip center region, or a center peripheral region.

The second electrode pad 175 may be electrically connected to a predetermined position of the second electrode 170. The second electrode pad 175 may be formed in single or plurality, and the plurality of second electrode pads 175 may be disposed separated from each other. The second electrode pad 175 is disposed on a region where the second electrode 170 intersects, or formed at a pattern diverging from the second electrode 170. Additionally, the second electrode pad 175 may be disposed on the center region, a center peripheral region, and the edge region, and the center region of each side, but is not limited thereto.

Here, the second electrode pad 175 may be a portion of the second electrode 170 or may be additionally formed in the second electrode 170.

The second electrode part 170 and 175 diffuses current and supplies it through the transparent electrode layer 145 and the second conductive semiconductor layer 140. The second electrode part 170 and 175 prevents current from being concentrated on one area and improves tolerance for ESD.

Here, during the forming of the second electrode part 170 and 175, an electrode material is prevented from flowing in the via hole 125 by masking it with a mask pattern or forming a dam structure.

Referring to FIGS. 11 and 13, once the second electrode parts 170 and 175 are formed, an insulation layer 150 is formed on the transparent electrode layer 145, the second electrode parts 170 and 175, and the via hole 125. The insulation layer 150 may be formed of a silicon oxide (e.g., $SiO_2$, etc.), a silicon nitride (e.g., $Si_xN$, etc.), a metal oxide (e.g., a Ti oxide), but is not limited thereto.

A second pad hole 151 is formed in the insulation layer 150, and the second electrode pad 175 is exposed through the second pad hole 151.

as illustrated in FIG. 12, the insulation part 155, i.e., a portion of the insulation layer 150, is formed in the via hole 125, and an electrode hole 127 is formed in the insulation part 155. the depth exposing the first conductive semiconductor layer 120 in the insulation layer is formed.

An electrode hole 152 may be formed through wet etching or plasma etching. The diameter of the electrode hole 152 may be smaller than that (D2 of FIG. 7) of the via hole 125 of FIG. 7.

Additionally, the forming of the insulation layer 150 may be performed at least one time or a partial etching process can be repeatedly performed in order to form the via hole 125 and the electrode hole 125, but is not limited thereto.

The electrode hole 152 may be formed with the depth identical to or deeper than that of the via hole.

Insulation layer 150 and 155 are formed on the electrode hole 152 and the via hole 125 of FIG. 7. Here, the insulation layer 150 does not flow into the second pad hole 151 because of a mask pattern.

Referring to FIGS. 12 and 13, first electrode part 160 and 165 is formed on the insulation layer 150. The first electrode part 160 and 165 comprises a first electrode 160 and a first electrode pad 165.

The first electrode 160 and the first electrode pad 165 may be formed of at least one or a plurality of mixed material selected from Ti, Al, In, Ta, Pd, Co, Ni, Si, Ge, Ag, and Au, and may be formed with a single layer or multi layer structure. The first electrode pad 165 may be used as a portion of the first electrode 160 or may be additionally formed.

The first electrode 160 is formed of a pattern of a polygonal form such as a quadrangle form, a pentagonal form, and a hexagonal form. The first electrode 160 may have at least one of a line-shaped pattern, a curve-shaped pattern, a line and curve mixed pattern, a branch-shaped pattern branching one pattern into the plural number of patterns, a polygonal pattern, a striped pattern, a lattice pattern, a dot pattern, a diapered pattern, a parallelogram pattern, a mesh pattern, a streak pattern, a cross pattern, a radial pattern, and a combinational pattern thereof, but is not limited thereto.

The first electrode 160 comprises a diverge electrode 161 diverging toward the inner side direction and a via electrode 163 connected to the diverge electrode 161. The diverge electrode 161 may diverge into at least one branch form in the pattern of the first electrode 160, and in a case of a multi-branch (e.g., a fork form), the branches are spaced a predetermined interval from each other.

If the first electrode 160 is formed with a pattern of a polygonal form, the diverge electrode 161 may diverge toward the pattern inner direction or/and outer direction of the polygonal form, and a diverge node 162 and the first electrode pad 165 may be electrically connected to the end portion of the diverge electrode 161.

The electrode hole 127 is disposed under diverge node 162 and/or the first electrode pad 165, and the electrode hole 152 is filled with a first electrode material to form the via electrode 163.

The via electrode 163 may ohmic-contact the first conductive semiconductor layer 120 through the electrode hole 127.

Since a via electrode 163 is formed under the diverge node 162 and the first electrode pad 165, it may be electrically connected to the first conductive semiconductor layer 120 in a via form.

A partial pattern of the first electrode 160 may overlap a partial pattern of the second electrode 170. The first electrode 160 and the second electrode 170 are disposed at both sides of the insulation layer 150, and partial patterns of the first and second electrodes 160 and 170 may overlap spatially at both sides of the insulation layer 150.

Additionally, the patterns of the first electrode 160 and the second electrode 170 are disposed crossing over each other, but are not limited to the overlapping structure.

A first electrode part 160 and 165 and the second electrode pad 175 are exposed on the insulation layer 150.

Additionally, the first electrode pad 165 and the second electrode pad 175 are spaced apart from each other, and may be disposed on the center region, the center peripheral region, the edge region, and the center of each side of a chip, but are not limited thereto.

Since partial patterns of the first and second electrodes 160 and 170 overlap spatially, light emitting area reduction of the active layer 130 can be prevented and thus external light emitting efficiency can be improved.

FIGS. 17 to 20 are views illustrating a process of fabricating a semiconductor light emitting device according to a second embodiment. When describing the second embodiment, overlapping description related to the first embodiment will be omitted for conciseness.

Referring to FIG. 17, a first conductive semiconductor layer 120, an active layer 130, and a second conductive semiconductor layer 140 are sequentially formed on a substrate 110. Another semiconductor layer may be formed on/under each of the semiconductor layer, but is not limited thereto.

Once the second conductive semiconductor layer 140 is formed, mesa etching is performed on the channel region (i.e., a chip boundary region) to expose the outer region of the first semiconductor layer 120. The process may not be performed.

During the mesa etching, at least one via hole 125 is formed. The via hole 125 penetrates from the second conductive semiconductor layer 140 to a portion of the first conductive semiconductor layer 120, or passes through the first conductive semiconductor layer 120.

Here, the forming of the via hole 125 may be performed after the forming of the second conductive semiconductor layer 140 or the forming of the transparent electrode layer. The via hole 125 may have a circular pillar form or a polygonal pillar form, but is not limited thereto.

A transparent electrode layer 145 is formed on the second conductive semiconductor layer 140. A second electrode part 170 and 175 and a via electrode 163A are formed on the transparent electrode layer 145.

At this point, the second electrode part 170 and 175 comprises a second electrode 170 of a predetermined pattern and at least one second electrode pad 175. For example, the second electrode part 170 and 175 may be formed of at least one layer using a mixed material comprising at least one of Ag, Ag alloy, Ni, Al, Al alloy, Rh, Pd, Ir, Ru, Mg, Zn, Pt, Au, and Hf, but are not limited thereto. The second electrode part 170 and 175 refers to the first embodiment.

The via electrode 163A is formed with a predetermined thickness in the via hole 125. One end of the via electrode 163A contacts on the first conductive semiconductor layer 120, and does not contact the other layers 130, 140, and 145.

Here, the second electrode part 170 and 175 and the via electrode 163A are formed through the same process. In this case, the second electrode part 170 and 175 and the via electrode 163A are formed of the same material.

Additionally, the second electrode part 170 and 175 are formed through separate processes. For example, after the forming of the second electrode part 170 and 175, the via electrode 163A can be formed. Or, after the forming of the via electrode 163A, the second electrode part 170 and 175 can be formed. This process order may vary.

The second electrode part 170 and 175 diffuses current through the transparent electrode layer 145 and the second conductive semiconductor layer 140 and then supplies it. The second electrode part 170 and 175 prevents current to be concentrated on one place such that tolerance for ESD can be improved.

Referring to FIGS. 18 and 19, once the second electrode part 170 and 175 and the via electrode 163A are formed, an insulation layer 150 is formed. The insulation layer 150 is formed on the transparent electrode layer 145 and the second electrode part 170 and 175. A portion of the insulation layer 150 is formed around the via hole 125 to insulate the via electrode 163A.

The insulation layer 150 may be formed of a silicon oxide (e.g., $SiO_2$, etc.), a silicon nitride (e.g., $Si_xN$, etc.), a metal oxide (e.g., a Ti oxide), but is not limited thereto.

A second pad hole 151 is formed in the insulation layer 150, and the second electrode pad 175 is opened through the second pad hole 151.

At least one electrode hole 127A is formed in the insulation part 155. The electrode hole 127A has a depth by which the via electrode 163A is exposed.

The electrode hole 127A may be formed through wet etching or plasma etching. The diameter of the electrode hole 127A may be identical to or less than that of the via electrode 163A, but is not limited thereto.

Referring to FIGS. 19 and 20, a first electrode part 160 and 165 is formed on the insulation layer 150. The first electrode part 160 and 165 comprises a first electrode 160 of a predetermined pattern and at least one first electrode pad 165.

The first electrode 160 and the first electrode pad 165 may be formed of at least one or a plurality of mixed material selected from Ti, Al, In, Ta, Pd, Co, Ni, Si, Ge, Ag, and Au, and may be formed with a single layer or multi layer structure. The first electrode pad 165 may be used as a portion of the first electrode 160 or may be additionally formed. The first electrode part 160 and 165 refers to the first embodiment.

A diverge node 162 of the first electrode 160 is electrically connected to the via electrode 163A, with the form of the via electrode 163B. That is, the via electrode 163B is connected to the via electrode 163 when the electrode hole 127A is filled with a first electrode material.

Since the via electrodes 163A and 163B are formed under the diverge node 162 and the first electrode pad 165, it is electrically connected to the first conductive semiconductor layer 120, in a via form.

A partial pattern of the first electrode 160 may overlap a partial pattern of the second electrode 170. The first electrode 160 and the second electrode 170 are disposed at both sides of the insulation layer 150, and partial patterns of the first electrode 160 and the second electrode 170 spatially overlap at the both sides of the insulation layer 150.

In the description of embodiments, it will be understood that when each layer (or film), area, pattern, or structure is referred to as being "on/under" another substrate, layer (or film), area, pad, or pattern, it can be "directly" on the another substrate, layer (or film), area, pad, or pattern, or intervening layers may also be "indirectly" present.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

Embodiments provide a semiconductor light emitting device.

Embodiments provide the degree of pattern freedom for a semiconductor light emitting device.

The invention claimed is:

1. A semiconductor light emitting device, comprising:
   a first conductive semiconductor layer;
   an active layer on the first conductive semiconductor layer;
   a second conductive semiconductor layer on the active layer;
   a second electrode part on the second conductive semiconductor layer;
   an insulation layer on the second electrode part; and
   a first electrode part on the insulation layer, a portion of the first electrode part being electrically connected to the first conductive semiconductor layer,
   wherein the insulation layer is disposed between the first electrode part and the second electrode part,
   wherein the insulation layer includes a first hole and a via hole spaced apart from the first hole, and
   wherein a portion of the second electrode part is disposed in the first hole of the insulation layer.

2. The semiconductor light emitting device according to claim 1, wherein the first electrode part comprises:
   a first electrode comprising at least one form of a pattern;
   at least one first electrode pad connected the first electrode; and
   a connection electrode in at least one of the first electrode and the first electrode pad.

3. The semiconductor light emitting device according to claim 2,
   wherein the connection electrode is disposed in the via hole perpendicularly penetrating the insulation layer, the second conductive semiconductor layer, the active layer, and a portion of the first conductive semiconductor layer; and
   the insulation layer is further disposed on a circumference of the connection electrode in the via hole.

4. The semiconductor light emitting device according to claim 2, wherein the first electrode comprises at least one of a line-shaped pattern, a curve-shaped pattern, a line and curve mixed pattern, a branch-shaped pattern branching one pattern into the plural number of patterns, a polygonal pattern, a striped pattern, a lattice pattern, a dot pattern, a diapered pattern, a parallelogram pattern, a mesh pattern, a streak pattern, a cross pattern, a radial pattern, and a combinational pattern thereof.

5. The semiconductor light emitting device according to claim 1, comprising:
   a transparent electrode layer between the second conductive semiconductor layer and the second electrode part,
   wherein the second electrode part is connected to at least one of the second conductive semiconductor layer and the transparent electrode layer.

6. The semiconductor light emitting device according to claim 1, wherein the second electrode part comprises:
   a second electrode comprising at least one form of a pattern; and
   a second electrode pad connected to the second electrode and disposed in the first hole of the insulation layer.

7. The semiconductor light emitting device according to claim 6, wherein the second electrode comprises at least one of a line-shaped pattern, a curve-shaped pattern, a line and curve mixed pattern, a branch-shaped pattern branching one pattern into the plural number of patterns, a polygonal pattern, a striped pattern, a lattice pattern, a dot pattern, a diapered pattern, a parallelogram pattern, a mesh pattern, a streak pattern, a cross pattern, a radial pattern, and a combinational pattern thereof.

8. The semiconductor light emitting device according to claim 1, wherein a first portion of the first electrode part on the insulation layer overlaps spatially a first portion of the second electrode part under the insulation layer and the second electrode part is disposed around the portion of the first electrode part.

9. A semiconductor light emitting device, comprising:
   a first conductive semiconductor layer;
   an active layer on the first conductive semiconductor layer;
   a second conductive semiconductor layer on the active layer;
   a second electrode part on the second conductive semiconductor layer;
   an insulation layer on the second electrode part;
   a transparent electrode layer disposed between the second electrode part and the second conductive semiconductor layer; and
   a first electrode part on the insulation layer, a portion of the first electrode part being electrically connected to the first conductive semiconductor layer through a via hole,
   wherein the transparent electrode layer includes a hole and the portion of the first electrode part is disposed in the hole.

10. The semiconductor light emitting device according to claim 9, wherein the first electrode part comprises:
    a first electrode comprising at least one form of a pattern;
    at least one first electrode pad connected to the first electrode; and
    at least one connection electrode in at least one of the first electrode and the first electrode pad, the connection electrode being electrically connected to the first conductive semiconductor layer.

11. The semiconductor light emitting device according to claim 9, wherein the insulation layer comprises a second pad hole exposing the second electrode pad which is disposed in the second pad hole.

12. The semiconductor light emitting device according to claim 9, wherein:
    at least one of the first electrode part and the second electrode part comprises at least one of a line-shaped pattern, a curve-shaped pattern, a line and curve mixed pattern, a branch-shaped pattern branching one pattern into the plural number of patterns, a polygonal pattern, a striped pattern, a lattice pattern, a dot pattern, a diapered pattern, a parallelogram pattern, a mesh pattern, a streak pattern, a cross pattern, a radial pattern, and a combinational pattern thereof; and
    the first electrode part and the second electrode part are disposed crossing over each other at both sides of the insulation layer or partial patterns thereof overlap each other.

13. The semiconductor light emitting device according to claim 9, wherein the transparent electrode layer includes a transparent electrode layer or a reflective electrode layer.

14. A semiconductor light emitting device comprising:
    a light emitting structure including a first conductive semiconductor layer, a second conductive semiconductor layer, and an active layer between the first conductive semiconductor layer and the second conductive semiconductor layer;
    an insulation layer on the light emitting structure, the insulation layer including a plurality of holes;
    a second electrode between the insulation layer and the light emitting structure;
    a second pad connected to the second electrode, the second pad disposed in at least one of the holes of the insulation layer;

a first electrode on the insulation layer; and a connection electrode connected between the first electrode and the first conductive semiconductor layer.

15. The semiconductor light emitting device according to claim 14, wherein the connection electrode includes a first portion in contact with the first conductive semiconductor layer and a second portion in contact with the first electrode, wherein the second portion of the connection electrode has a width smaller than that of the first portion of the connection electrode.

16. The semiconductor light emitting device according to claim 14, wherein a portion of the insulation layer is disposed between an inner portion of the light emitting structure and the connection electrode.

17. The semiconductor light emitting device according to claim 14, wherein the connection electrode is disposed on a center area of patterns of the second electrode.

18. The semiconductor light emitting device according to claim 14, wherein a first portion of the first electrode overlaps spatially a first portion of the second electrode.

19. The semiconductor light emitting device according to claim 18, wherein the first portion of the first electrode and the first portion of the second electrode include a loop shape or/and a line shape.

20. The semiconductor light emitting device according to claim 14, comprising a substrate under the light emitting structure, and a transparent electrode layer between the insulation layer and the light emitting structure.

* * * * *